United States Patent [19]

Layher

[11] Patent Number: 4,552,267

[45] Date of Patent: Nov. 12, 1985

[54] CERAMIC SEMICONDUCTOR PACKAGE CHIP PREVENTION STRUCTURE AND METHOD

[75] Inventor: Francis W. Layher, Los Gatos, Calif.

[73] Assignee: National Semiconductor Corporation, Santa Clara, Calif.

[21] Appl. No.: 710,354

[22] Filed: Mar. 11, 1985

[51] Int. Cl.⁴ .................. B65D 85/30; B65D 81/00; H05F 3/02; H05K 5/00
[52] U.S. Cl. .................................. 206/334; 206/593; 206/330; 174/52 PE; 174/52 FP; 357/72; 357/74; 357/80; 29/588
[58] Field of Search ............... 206/334, 330, 331, 332, 206/328, 539; 220/69; 174/52 PE, 52 FP; 357/80, 74, 72; 29/588

[56] References Cited

U.S. PATENT DOCUMENTS

| | | | |
|---|---|---|---|
| 2,951,612 | 9/1960 | Salzenbrodt | 220/69 |
| 4,171,049 | 10/1979 | Nohara et al. | 206/334 |
| 4,231,901 | 11/1980 | Berbeco | 206/328 |
| 4,463,851 | 8/1984 | Cecil | 206/334 |
| 4,470,507 | 9/1984 | Burns | 206/330 |

*Primary Examiner*—William T. Dixson, Jr.
*Attorney, Agent, or Firm*—Gail W. Woodward; Paul J. Winters; Michael J. Pollock

[57] ABSTRACT

A hermetic ceramic semiconductor package is provided with impact absorbing bumpers by applying a composition of sealing glass loaded with malleable metal particles to the ceramic package. The bumpers are applied to the ceramic parts when they are being coated with sealing glass. When the hermetic package seal is formed the bumpers will form a metal loaded matrix that will absorb impacts and thereby avoid chipping of the ceramic package due to impacts during handling.

11 Claims, 2 Drawing Figures

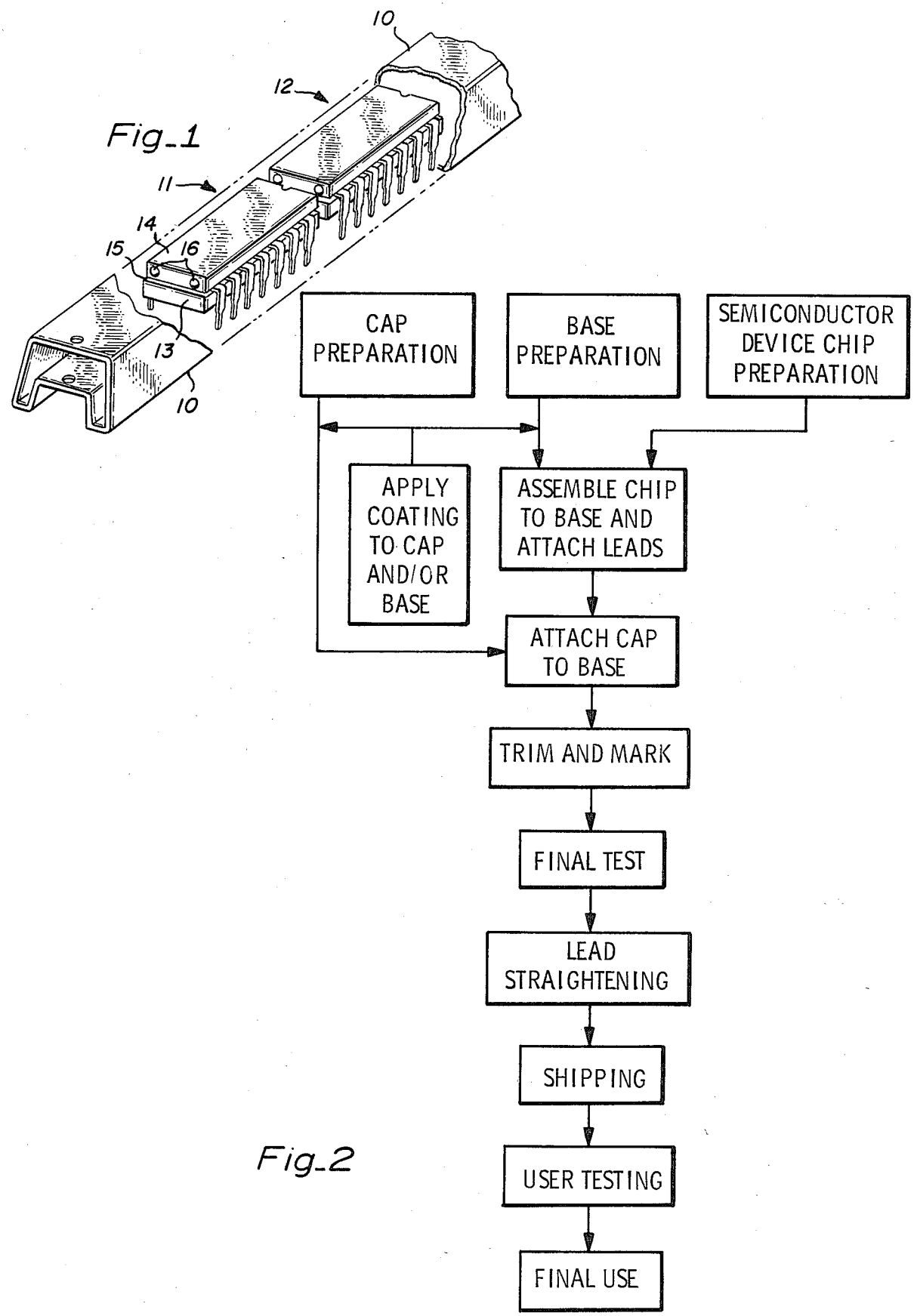
Fig_1
Fig_2

CERAMIC SEMICONDUCTOR PACKAGE CHIP PREVENTION STRUCTURE AND METHOD

BACKGROUND OF THE INVENTION

U.S. Pat. No. 4,355,719 issued to Sally K. Hines, Peter M. Weiler and Robert R. Hewitt on Oct. 26, 1982, and is assigned to the assignee of the present invention. The teaching in this patent is incorporated herein by reference. This patent solves the impact problem by applying a resilient, non-conductive, non-absorbent, heat-resistant material onto the surfaces of the ceramic packages. In the dual-in-line ceramic package a silicone polymer bump has proven successful in avoiding chipping in the larger packages such as the 40-lead structures. The silicone polymer is applied to the ends of the package, in the form of bumps, after encapsulation and then cured in place before the package is inserted into its handling rail. I have found that the silicone bumps significantly reduce chipping. However, when the bumps on adjacent packages are allowed to remain in contact with each other for extended periods of time, even at moderate temperatures, there is a tendency for them to stick together. This has proven to be troublesome particularly for the smaller low-lead-count packages. This sticking can occur for reasons not fully understood even when the silicone is properly cured. When the silicone is marginally cured or undercured, the incidence of sticking can rise to an unacceptable level.

SUMMARY OF THE INVENTION

It is an object of the invention to provide shock absorbing bumpers on a ceramic device package that will avoid sticking when the bumpers are allowed to remain in contact for an extended period of time.

It is a further object of the invention to form the shock absorbing bumpers on a ceramic package from a combination of malleable metal powder and sealing glass applied to the ends of the package where impact will occur.

It is a still further object of the invention to apply shock absorbing bumpers to the parts of a ceramic package prior to the hermetic sealing operation.

These and other objects are achieved by fabricating the shock absorbing bumpers on the ceramic package from a malleable metal particle loaded glass that is fired onto the ends of the package. A low melting glass such as the one used to seal the package is employed and is heavily loaded with particles of a metal such as silver, copper, aluminum, or alloys thereof.

It is a feature of the invention that the bumpers can be applied to the ceramic parts, prior to assembly, at the same time that the sealing glass is applied. Then, during assembly, the glass melts and seals to the ceramic. Thus, no separate cure needs to be used. After the glass is fired the structure will cushion impacts. The bump will act to distribute the impact force over a relatively large area. During an impact the glass itself is under compression, for which it is quite strong, and the metal particles will absorb the impact. The resulting bumpers show no tendency to stick together even after long contact at elevated temperatures.

BRIEF DESCRIPTION OF THE DRAWING

FIG. 1 shows a semiconductor device handling rail containing ceramic packaged devices employing the invention.

FIG. 2 is a flow chart showing the operations involved in the assembly and handling of the semiconductor devices.

DESCRIPTION OF THE INVENTION

In FIG. 1 a rail 10 is shown containing two ceramic packaged devices 11 and 12. In practice, rail 10 is about two feet long and will contain many such packages, the number being determined by the package size. Ordinarily the rail will be filled with parts that are secured in place by pins (not shown) pressed into holes located at the rail ends. In operation the devices are inserted into the end of the rail and allowed to slide down the tilted rail to a rest position adjacent to the previously inserted device. In order to facilitate rapid loading the rail will be tilted to a relatively steep angle. This results in unavoidable impacting that, without some form of bumpers, can result in chipping of the packages, usually at the corners.

The ceramic package includes a base 13, a cap 14 and a glass seal 15 which joins the cap to the base to form a hermetic seal. in the conventional CERDIP package shown, the lead array extends in two rows along the side edges. Bumps 16 are shown applied to the package caps. These bumps extend a short distance (about 50 microns) from the package surface and are resilient to act as shock absorbers. If desired, the coating could be extended to entirely cover the package end faces on both the caps and/or the bases.

Ceramic packages, as distinct from plastic packages, are hermetic. This requires that the ceramic packages be tested for hermeticity. A typical hermeticity test involves subjecting the package to an inert gas like helium or krypton at a high pressure and subsequently transferring the package to a low-pressure environment amd detecting the release of any gaseous material that would have entered the package during the higher pressure exposure had there been any leaks. This type of test requires that the coating material also be non-absorbent. If it were absorbent, it could release absorbed gas in the above test and lead to erroneous determinations of hermeticity.

Assembled devices typically undergo a significant number of tests. Some of these tests are conducted at elevated temperatures. It is therefore essential that the coating material be heat resistant besides being resilient. In the preferred embodiment it is necessary that the material withstand temperatures in excess of 300° C.

All of the above requirements are completely satisfied by employing a coating composed of glass filled with malleable metal particles. It is preferred that the glass be the same as the material employed at 15 where the cap 14 is sealed to base 13. In the typical CERDIP package this glass is a solder glass. A glass frit is grounded to a small particle size and suspended with a binder in a solvent. This material in paste form can be applied to a ceramic surface and fired to drive off the binder and solvent and to melt the glass. This produces a stable glass coating on the ceramic. Then, when a seal is to be made, the glassed parts are pressed together and fired at a temperature where the glass melts and joins with the other parts.

In practicing the invention a metal powder is mixed with the solder glass-binder-solvent combination. This mixture is applied to the ceramic parts, where the coating is desired, by conventional means. Then, when the package is sealed, the metal particle loaded glass produces a bump composed of a matrix of glass and malleable metal particles. The metal particles provide a shock absorbing cushion that prevents ceramic impact fracturing. The glass matrix that holds the metal particles in position forms a structure that, while weak in tension, is strong in compression which would occur under impact conditions. The malleable metal particles themselves absorb and distribute the force of the impacts and are simply held in position by the glass.

FIG. 2 is a block diagram showing the CERDIP assembly process. The base and cap ceramic pieces are first provided with a solder glass coating that is fired on at a temperature that will initially melt the glass and cause it to adhere to the ceramic. At this stage, the metal lead frame is glass sealed to the base. Then the previously prepared semiconductor device (or other electrical component) is mounted upon the lead frame and the usual interconnection wiring applied. Then the cap is pressed against the base and the assembly fired to produce the glass seal.

The package leads are then trimmed and the devices marked for their identity. At this point the individual packaged devices are slid into a handling rail for automated handling. In the subsequent operations, the devices are removed from a rail and the required operation performed after which the device is returned to the rail.

As explained above, the invention comprises forming the impact absorbing coating, such as bumps 16, at the cap and base preparation phase of assembly. The malleable metal, such as silver, copper or aluminum, is first reduced to a powder. It is preferred that the powder be in flake form where the flakes are about a micron thick and 10 to 20 microns across. The frit glass is mixed with a binder, such as nitrocellulose, in a solvent, such as terpineol base solvents, to produce a paste-like consistency. This paste is loaded with the powdered metal by adding about 80% by weight of metal. This material is thoroughly mixed and applied to the cap and/or base ceramic parts using conventional means such as silk screening. In the initial glass firing the binder and solvent are driven off and the paste will form a glass melt that will wet the ceramic where it is contact therewith.

The invention has been described and its nature set forth in detail. When the foregoing description is read by a person skilled in the art, alternatives and equivalents, within the spirit and intent of the invention, will be apparent. For example, while the invention is described with respect to encapsulating a semiconductor device, any electrical element could be so treated. Accordingly, it is intended that the scope of the invention be limited only by the following claims.

I claim:

1. In a ceramic package made up of parts sealed together to house an electronic device, which is to be handled in plural numbers pursuant to testing and using, wherein such handling may act to impact the devices and thereby chip said ceramic and a heat-resistant, non-absorbent, resilient coating material is located on said package to absorb said impact whereby the incidence of chipping of said ceramic is reduced, the improvement comprising:

said coating being composed of a glass loaded with malleable metal particles and fused to the surface of said ceramic package.

2. The package of claim 1 wherein said malleable metal is selected from the group consisting of silver, copper, aluminum and alloys thereof.

3. The package of claim 1 wherein said coating is in the form of a bump located on said package where said impact will occur.

4. The package of claim 1 wherein said package parts are sealed together with glass and the glass in said coating is the material employed in forming the package seal.

5. The package of claim 4 wherein said glass is a solder glass.

6. An improved method for manufacturing an electronic device housed in a ceramic package wherein said package is formed of parts that are sealed together to form a ceramic package that is to be handled in plural numbers pursuant to testing and using and wherein such handling may act to impact the packages and thereby chip said ceramic, said improved method comprising the step of:

applying a coating comprising malleable metal particles in a glass matrix to said package to render it resistant to mechanical shock and impact.

7. The improved method of claim 6 wherein said coating is applied to said ceramic prior to forming said package seal.

8. The improved method of claim 6 wherein said coating is applied to said package in the form of bumps located where the mechanical impact will occur.

9. The improved method of claim 6 wherein said package is assembled using a sealing glass and said glass matrix in said coating is the same as said sealing glass.

10. The improved method of claim 6 wherein said malleable metal particles are selected from the group consisting of silver, copper, aluminum and alloys thereof.

11. The improved method of claim 10 wherein said metal particles are formed into flakes.

* * * * *